(12) United States Patent
Bradley (10) Patent No.: US 10,365,345 B1
(45) Date of Patent: Jul. 30, 2019

(54) CALIBRATION DEVICE FOR USE WITH MEASUREMENT INSTRUMENTS

(71) Applicant: ANRITSU COMPANY, Morgan Hill, CA (US)

(72) Inventor: Donald Anthony Bradley, Morgan Hill, CA (US)

(73) Assignee: ANRITSU COMPANY, Morgan Hill, CA (US)

(*) Notice: Subject to any disclaimer, the term of this patent is extended or adjusted under 35 U.S.C. 154(b) by 115 days.

(21) Appl. No.: 15/368,433

(22) Filed: Dec. 2, 2016

Related U.S. Application Data

(60) Provisional application No. 62/262,300, filed on Dec. 2, 2015.

(51) Int. Cl.
*G01R 35/00* (2006.01)
*H04B 1/40* (2015.01)

(52) U.S. Cl.
CPC .............. *G01R 35/005* (2013.01); *H04B 1/40* (2013.01)

(58) Field of Classification Search
CPC ...... G01R 27/32; G01R 27/28; G01R 35/005; G01R 31/2837; H04B 17/14; H04B 17/0085; H04B 17/16; H04B 17/318; H04B 17/103; H04B 17/20
See application file for complete search history.

(56) References Cited

U.S. PATENT DOCUMENTS

| | | | |
|---|---|---|---|
| 5,801,525 | A | 9/1998 | Oldfield |
| 5,812,039 | A | 9/1998 | Oldfield |
| 5,909,192 | A | 6/1999 | Finch |
| 5,977,779 | A | 11/1999 | Bradley |
| 6,049,212 | A | 4/2000 | Oldfield |
| 6,291,984 | B1 | 9/2001 | Wong |
| 6,316,945 | B1 | 11/2001 | Kapetanic |
| 6,331,769 | B1 | 12/2001 | Wong |
| 6,496,353 | B1 | 12/2002 | Chio |
| 6,504,449 | B2 | 1/2003 | Constantine |
| 6,509,821 | B2 | 1/2003 | Oldfield |
| 6,525,631 | B1 | 2/2003 | Oldfield |
| 6,529,844 | B1 | 3/2003 | Kapetanic |
| 6,548,999 | B2 | 4/2003 | Wong |

(Continued)

*Primary Examiner* — Vinh P Nguyen
(74) *Attorney, Agent, or Firm* — Tucker Ellis LLP (57) ABSTRACT

A calibration device adapted to be used with a measurement instrument includes a controller, two or more ports, two or more power measurement circuits each connectable with one of the two or more ports, and a non-transitory computer readable storage medium accessible to the controller within which characterization data related to the two or more ports is storable. The calibration device is adapted to be connected with the measurement instrument via a data bus to transmit data and receive commands between the controller and the measurement instrument. The two or more ports are adapted to be interchangeably connectable with ports of the measurement instrument. When the ports of the measurement instrument are connected with the two or more ports of the calibration device and a signal is transmitted by the measurement instrument to the calibration device, a connection configuration between the measurement instrument and the calibration device can be determined based on a detection of power at the two or more power measurement circuits.

17 Claims, 6 Drawing Sheets

(56) References Cited

U.S. PATENT DOCUMENTS

| | | | | |
|---|---|---|---|---|
| 6,650,123 | B2 | 11/2003 | Martens | |
| 6,665,628 | B2 | 12/2003 | Martens | |
| 6,670,796 | B2 | 12/2003 | Mori | |
| 6,680,679 | B2 | 1/2004 | Stickle | |
| 6,700,366 | B2 | 3/2004 | Truesdale | |
| 6,700,531 | B2 | 3/2004 | Abou-Jaoude | |
| 6,714,898 | B1 | 3/2004 | Kapetanic | |
| 6,766,262 | B2 | 7/2004 | Martens | |
| 6,832,170 | B2 | 12/2004 | Martens | |
| 6,839,030 | B2 | 1/2005 | Noujeim | |
| 6,882,160 | B2 | 4/2005 | Martens | |
| 6,888,342 | B2 | 5/2005 | Bradley | |
| 6,894,581 | B2 | 5/2005 | Noujeim | |
| 6,917,892 | B2 | 7/2005 | Bradley | |
| 6,928,373 | B2 | 8/2005 | Martens | |
| 6,943,563 | B2 | 9/2005 | Martens | |
| 7,002,517 | B2 | 2/2006 | Noujeim | |
| 7,011,529 | B2 | 3/2006 | Oldfield | |
| 7,016,024 | B2 | 3/2006 | Bridge | |
| 7,019,510 | B1 | 3/2006 | Bradley | |
| 7,054,776 | B2 | 5/2006 | Bradley | |
| 7,061,254 | B1 * | 6/2006 | Shoulders | G01R 27/28 324/601 |
| 7,068,046 | B2 | 6/2006 | Martens | |
| 7,088,111 | B2 | 8/2006 | Noujeim | |
| 7,108,527 | B2 | 9/2006 | Oldfield | |
| 7,126,347 | B1 | 10/2006 | Bradley | |
| 7,284,141 | B2 | 10/2007 | Stickle | |
| 7,304,469 | B1 | 12/2007 | Bradley | |
| 7,307,493 | B2 | 12/2007 | Feldman | |
| 7,509,107 | B2 | 3/2009 | Bradley | |
| 7,511,577 | B2 | 3/2009 | Bradley | |
| 7,521,939 | B2 | 4/2009 | Bradley | |
| 7,545,151 | B2 | 6/2009 | Martens | |
| 7,683,602 | B2 | 3/2010 | Bradley | |
| 7,683,633 | B2 | 3/2010 | Noujeim | |
| 7,705,582 | B2 | 4/2010 | Noujeim | |
| 7,746,052 | B2 | 6/2010 | Noujeim | |
| 7,764,141 | B2 | 7/2010 | Noujeim | |
| 7,872,467 | B2 | 1/2011 | Bradley | |
| 7,924,024 | B2 | 4/2011 | Martens | |
| 7,957,462 | B2 | 6/2011 | Aboujaoude | |
| 7,983,668 | B2 | 7/2011 | Tiernan | |
| 8,027,390 | B2 | 9/2011 | Noujeim | |
| 8,058,880 | B2 | 11/2011 | Bradley | |
| 8,145,166 | B2 | 3/2012 | Barber | |
| 8,156,167 | B2 | 4/2012 | Bradley | |
| 8,159,208 | B2 | 4/2012 | Brown | |
| 8,169,993 | B2 | 5/2012 | Huang | |
| 8,185,078 | B2 | 5/2012 | Martens | |
| 8,278,944 | B1 * | 10/2012 | Noujeim | G01R 27/04 324/637 |
| 8,294,469 | B2 | 10/2012 | Bradley | |
| 8,305,115 | B2 | 11/2012 | Bradley | |
| 8,306,134 | B2 | 11/2012 | Martens | |
| 8,400,165 | B2 * | 3/2013 | Reichel | G01R 35/005 324/601 |
| 8,410,786 | B1 | 4/2013 | Bradley | |
| 8,417,189 | B2 | 4/2013 | Noujeim | |
| 8,457,187 | B1 | 6/2013 | Aboujaoude | |
| 8,493,111 | B1 | 7/2013 | Bradley | |
| 8,498,582 | B1 | 7/2013 | Bradley | |
| 8,593,158 | B1 | 11/2013 | Bradley | |
| 8,629,671 | B1 | 1/2014 | Bradley | |
| 8,630,591 | B1 | 1/2014 | Martens | |
| 8,666,322 | B1 | 3/2014 | Bradley | |
| 8,718,586 | B2 | 5/2014 | Martens | |
| 8,760,148 | B1 | 6/2014 | Bradley | |
| 8,816,672 | B1 | 8/2014 | Bradley | |
| 8,816,673 | B1 | 8/2014 | Barber | |
| 8,884,664 | B1 | 11/2014 | Bradley | |
| 8,903,149 | B1 | 12/2014 | Noujeim | |
| 8,903,324 | B1 | 12/2014 | Bradley | |
| 8,942,109 | B2 | 1/2015 | Dorenbosch | |
| 9,103,856 | B2 | 8/2015 | Brown | |
| 9,103,873 | B1 | 8/2015 | Martens | |
| 9,176,174 | B1 | 11/2015 | Bradley | |
| 9,176,180 | B1 | 11/2015 | Bradley | |
| 9,210,598 | B1 | 12/2015 | Bradley | |
| 9,239,371 | B1 | 1/2016 | Bradley | |
| 9,287,604 | B1 | 3/2016 | Noujeim | |
| 9,331,633 | B1 | 5/2016 | Robertson | |
| 9,366,707 | B1 | 6/2016 | Bradley | |
| 9,455,792 | B1 | 9/2016 | Truesdale | |
| 9,560,537 | B1 | 1/2017 | Lundquist | |
| 9,571,142 | B2 | 2/2017 | Huang | |
| 9,588,212 | B1 | 3/2017 | Bradley | |
| 9,594,370 | B1 | 3/2017 | Bradley | |
| 9,606,212 | B1 | 3/2017 | Martens | |
| 9,696,403 | B1 | 7/2017 | Elder-Groebe | |
| 9,720,023 | B2 * | 8/2017 | Ziomek | H04B 17/16 |
| 9,733,289 | B1 | 8/2017 | Bradley | |
| 9,753,071 | B1 | 9/2017 | Martens | |
| 9,768,892 | B1 | 9/2017 | Bradley | |
| 9,860,054 | B1 | 1/2018 | Bradley | |
| 9,964,585 | B1 | 5/2018 | Bradley | |
| 9,967,085 | B1 | 5/2018 | Bradley | |
| 9,977,068 | B1 | 5/2018 | Bradley | |
| 10,003,453 | B1 | 6/2018 | Bradley | |
| 10,006,952 | B1 | 6/2018 | Bradley | |
| 10,064,317 | B1 | 8/2018 | Bradley | |
| 10,116,432 | B1 | 10/2018 | Bradley | |
| 2006/0250135 | A1 | 11/2006 | Buchwald | |
| 2011/0037667 | A1 | 2/2011 | Varjonen | |
| 2016/0050032 | A1 | 2/2016 | Emerson | |

* cited by examiner

CALIBRATION DEVICE FOR USE WITH MEASUREMENT INSTRUMENTS

CLAIM OF PRIORITY

This application claims the benefit of priority to U.S. Provisional Application titled "UNASSIGNED MULTI-PORT IMPEDANCE CALIBRATION DEVICE", Application No. 62/262,300, filed Dec. 2, 2015, which application is herein incorporated by reference.

TECHNICAL FIELD

The present invention relates generally to devices and methods for calibrating instruments for measuring the electrical response of electrical networks and components of electrical networks to signals.

BACKGROUND

Some measurement instruments require calibration for accurately measuring the electrical response of a device under test (DUT) to test signals transmitted by the measurement instrument. For example, measurement calibration of a vector network analyzer (VNA) used to measure scattering (S-) parameters for a DUT is necessary as part of the setup to measuring the DUT. Measurements performed without calibration will be limited due to imperfections.

A VNA is a reflectometer-based electronic instrument that can be used to measure the frequency response (magnitude and phase) of a DUT such as an electrical network, component, circuit, or sub-assembly. A VNA makes use of a frequency sweeping source or stimulus, directional couplers, and one or more receivers that provide ratioed amplitude and phase information such as reflection and transmission coefficients. VNAs commonly measure s-parameters because reflection and transmission of electrical networks are relatively easy to measure at high frequencies. VNAs are often used to characterize two-port networks such as amplifiers and filters, but they can be used on networks with an arbitrary number of ports.

The basic architecture of a network analyzer involves a signal generator, a test set, one or more receivers and display. In some setups, these units are distinct instruments. Most VNAs have two test ports, permitting measurement of four S-parameters ($S_{11}$, $S_{21}$, $S_{12}$ and $S_{22}$), but instruments with more than two ports are available commercially.

A VNA achieves highly accurate measurements by correcting for the systematic errors in the instrument and the characteristics of cables, adapters and test fixtures. The process of error correction is commonly just called calibration and may be performed by an engineer several times in an hour. Sometimes it is called user-calibration to indicate the difference from periodic calibration by a manufacturer.

In a typical 1-port reflection calibration, the user measures three known standards, usually an open (O), a short (S) and a known load (L). From these three measurements the network analyzer can account for directivity errors resulting from the portion of the source signal that never reaches the DUT, source match errors resulting from multiple internal reflections between the source and the DUT, and reflection tracking errors resulting from all frequency dependence of test leads, connections, etc.

A more complex calibration is a full 2-port reflectivity and transmission calibration. For two ports there are 12 possible systematic errors analogous to the three above. The most common method for correcting for these involves measuring a short, load and open standard on each of the two ports, as well as transmission between the two ports.

SUMMARY

In accordance with an embodiment, a calibration device adapted to be used with a measurement instrument includes a controller, two or more ports, two or more power measurement circuits each connectable with one of the two or more ports, and a non-transitory computer readable storage medium accessible to the controller within which characterization data related to the two or more ports is storable. The calibration device is adapted to be connected with the measurement instrument via a data bus to transmit and receive data between the controller and the measurement instrument. The two or more ports are adapted to be interchangeably connectable with the ports of the measurement instrument. When the ports of the measurement instrument are connected with the two or more ports of the calibration device and a signal is transmitted by the measurement instrument to the calibration device, a connection configuration between the measurement instrument and the calibration device can be determined based on a detection of power at the two or more power measurement circuits.

In accordance with an embodiment, a calibration device adapted to be used with a measurement instrument includes a controller, a first port connectable to a first power measurement circuit, a second port connectable to a second power measurement circuit and memory accessible to the controller and within which characterization data related to the first port and the second port is stored. The calibration device is adapted to be connected with the measurement instrument via a data bus to transmit data and receive commands between the controller and the measurement instrument. The first port and the second port are adapted interchangeably connectable with ports of the measurement instrument. A connection configuration between the ports of the measurement instrument and the first port and the second port of the calibration device can be determined based on a detection of power at the first power measurement circuit or the second power measurement circuit.

In accordance with an embodiment, characterization data related to the first port and the second ports are retrieved by the controller and provided to the measurement instrument via the data bus based on the detection of power at the first power measurement circuit or the second power measurement circuit.

In accordance with an embodiment, the first port and the second port of the calibration device are selectably connectable with an open circuit, a load, a short circuit, and a thru signal path, and wherein the first port is selectably connectable to the first power measurement circuit via the thru signal path and the second port is selectably connectable to the second power measurement circuit via the thru signal path.

In accordance with an embodiment, the calibration device automatically provides the correct characterization data for the first and second ports to the measurement instrument via a data bus based on the connection configuration of the port one and the port two of the measurement instrument to the first port and the second port.

In accordance with an embodiment, The calibration device further includes a third port connectable to a third power measurement circuit and a fourth port connectable to a fourth power measurement circuit and characterization data related to the third port and the fourth port is stored within the memory. The first, second, third and fourth ports are adapted to be interchangeably connectable with ports of a measurement instrument. When the ports of the measurement instrument are connected with the calibration device and a signal is transmitted by the measurement instrument to the calibration device a connection configuration can be determined based on a detection of power at the power measurement circuits

BRIEF DESCRIPTION OF THE DRAWINGS

Further details of the present invention are explained with the help of the attached drawings in which.

DETAILED DESCRIPTION

The following description is of the best modes presently contemplated for practicing various embodiments of the present invention. The description is not to be taken in a limiting sense but is made merely for the purpose of describing the general principles of the invention. The scope of the invention should be ascertained with reference to the claims. In the description of the invention that follows, like numerals or reference designators will be used to refer to like parts or elements throughout. In addition, the first digit of a reference number for an embodiment of the invention identifies the sequence in which an individual embodiment is described.

It would be apparent to one of skill in the art that the present invention, as described below, may be implemented in many different embodiments of hardware, software, firmware, and/or the entities illustrated in the figures. Further, the frequencies given for signals generated and/or used, and the values for electronic components (e.g., resistors, capacitors, etc.) in the figures and description are merely exemplary. Any actual software, firmware and/or hardware described herein, as well as any frequencies of signals generated thereby and any values for electronic components, are not limiting of the present invention. Thus, the operation and behavior of the present invention will be described with the understanding that modifications and variations of the embodiments are possible, given the level of detail presented herein.

Measurement instruments, including vector network analyzers (VNAs), are calibrated prior to measuring the electrical response of a device under test (DUT) to test signals to correct for imperfections of the measurement instrument and interconnects with the DUT. During calibration an operator connects a calibration device to the measurement instrument. The calibration device includes a set of standards and switches that have been characterized. The measurement instrument uses characterization data for the calibration device to correctly calibrate itself to correct for errors in DUT measurements.

Present external calibration devices rely on connecting cables or other transmission lines from ports of a measurement instrument to ports on the calibration device based on the matching port names. For example Port 1 on the measurement instrument to be calibrated must be connected to Port 1 on the calibration device. This is necessary because all non-ideal calibration components are characterized at the factory and stored in non-volatile memory resident in the calibration device. This data is then inversely applied to the actual measured data to produce an ideal calibration standard. If, for example, Port 1 of the instrument to be calibrated were to be connected to Port 2 of the calibration device, the internally stored data for Port 1 would be used for the correction of the non-ideal Port 2 calibration port, leading to an erroneous calibration.

FIGS. 1-6 illustrate a calibration device for use with a measurement instrument that enables any measurement instrument port to connect to any of the ports of the calibration device, in accordance with an embodiment. The calibration device, which in an embodiment can be referred to as a remote, multiport impedance calibration device with unassigned calibration ports, can be used in any orientation.

Figure 1:
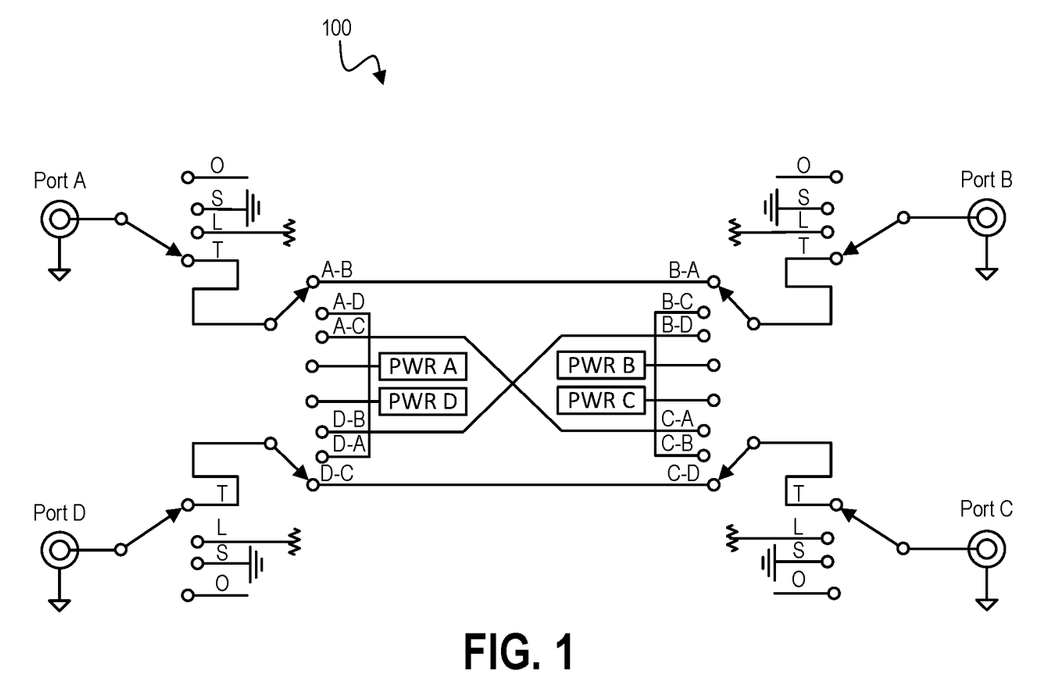
FIG. 1 is a circuit diagram of a device for use in calibrating a measurement instrument, in accordance with an embodiment.

FIG. 1 is a circuit diagram of a calibration device 100, in accordance with an embodiment. As shown, the calibration device is a 4-port calibration device (Port A, Port B, Port C, Port 1)) usable as a 2-port calibration device (any two of Port A, Port B, Port C, Port D). Alternatively, the calibration device can include 2-ports, 3-ports or any other number of ports.

As can be seen, each of the ports is switchably connectable to standards for an open (O), a short (S) and a known load (L), and further switchably connectable to a thru (T) signal path that itself is switchably connectable to any of the other ports. For example, Port A is switchably connectable at the thru (T) signal path with Port B (A-B/B-A), Port C (A-C/C-A) and Port D (A-DID-A). Additionally, each port is switchably connectable via the thru (T) signal path to a power measurement circuit (also referred to herein as a "power meter"). As shown each of the ports is connectable with a power meter associated with that port.

In an embodiment, the power meter can be used to detect the presence of a signal at an associated port, indicating that a signal is transmitted through the port. For example, if a VNA is connected from Port 1 of the VNA to a first port of the device labeled "Port B" and a test signal is transmitted from the VNA to the device via Port 1, detection of the signal at the power meter associated with Port B indicates connection of Port 1 with Port B. The characterization data associated with Port B is used by the VNA to calibrate the VNA to error correct measurements made of a DUT. For a two-port calibration device, the characterization data associated with the second port (e.g., Port A) is then also known and can be used by the VNA to calibrate the VNA via the second port. For a four-port calibration device, further signals can be purposefully transmitted for detection at power meters associated with specific ports to identify a connection configuration between the measurement instrument and the calibration device.

Knowing the characterization data of each of the ports for any connection configuration enables the VNA to be accurately calibrated. Once the VNA is calibrated, it can be connected with the DUT for measuring the electrical response of the DUT. Optionally, the calibration device can be connected with a measurement instrument through a DUT connected between the calibration device and the measurement instrument and used as a power meter. For example, the measurement instrument can perform a frequency sweep to determine the linearity of the DUT based on the power measured at the calibration device by the power meter associated with the connected port of the calibration device.

In an embodiment, the calibration device can automatically determine the connection configuration of the ports with ports of the measurement instrument and supply the correct characterization data for the ports to the measurement instrument based on the connection configuration. For example, where a universal serial bus (USB) connection is used, the calibration device can be powered on by connection via the USB to a measurement instrument and detect any signals transmitted to the calibration device via the ports of the calibration device using the power meters. In an embodiment, upon detecting a signal at the power meter, the calibration device can automatically retrieve characterization data from on-board memory and communicate the appropriate data to the measurement instrument. Alternatively, a user can be prompted to perform port check for determining the connection configuration and indicate to the user that characterization data for the ports is uploaded to the measurement instrument and/or available to the measurement instrument.

As will be appreciated, the device can allow for less bending of measurement instrument test port cables, providing convenience for the user and further allows users to avoid misconnection resulting in inaccurate calibration of the measurement instrument.

Figure 2:
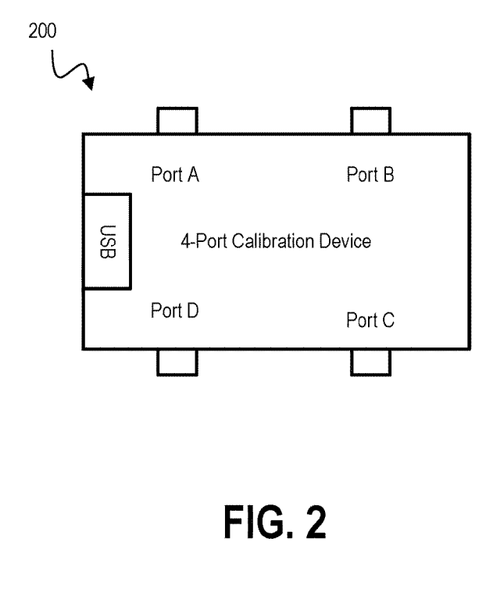
FIG. 2 is a simplified top view of a housing for an implementation of a device for use in calibrating a measurement instrument, in accordance with an embodiment.

FIG. 2 is a simplified view of a housing 200 and port layout for an implementation of a calibration device, in accordance with an embodiment. As can be seen, when used as a 4-port calibration device, the upper ports (relative to the page) serve as Port A and Port B (from left to right) and the lower ports serve as Port C and Port D (from right to left). The housing includes a connection via a data bus, such as USB, for communicating data and commands between the calibration device and a measurement instrument. The calibration device can also be powered via a USB connection. Alternatively, some other connection type(s) can be used for transmitting and receiving data and commands between the calibration device and the measurement instrument. The device can further include any transmission line connector types, including a set of N-, K-, 3.5 mm or SMA-type connectors. The device can include any combination of male-male, female-female and/or male-female connectors.

Figure 3A:
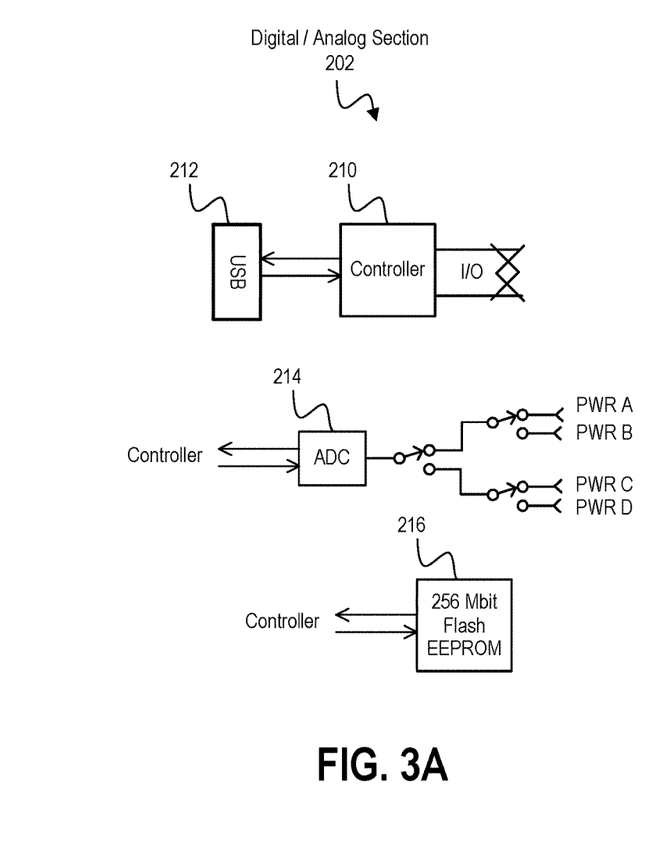
FIG. 3A is a block diagram of a digital/analog section for an implementation of a device for use in calibrating a measurement instrument, in accordance with an embodiment.
Figure 3B:
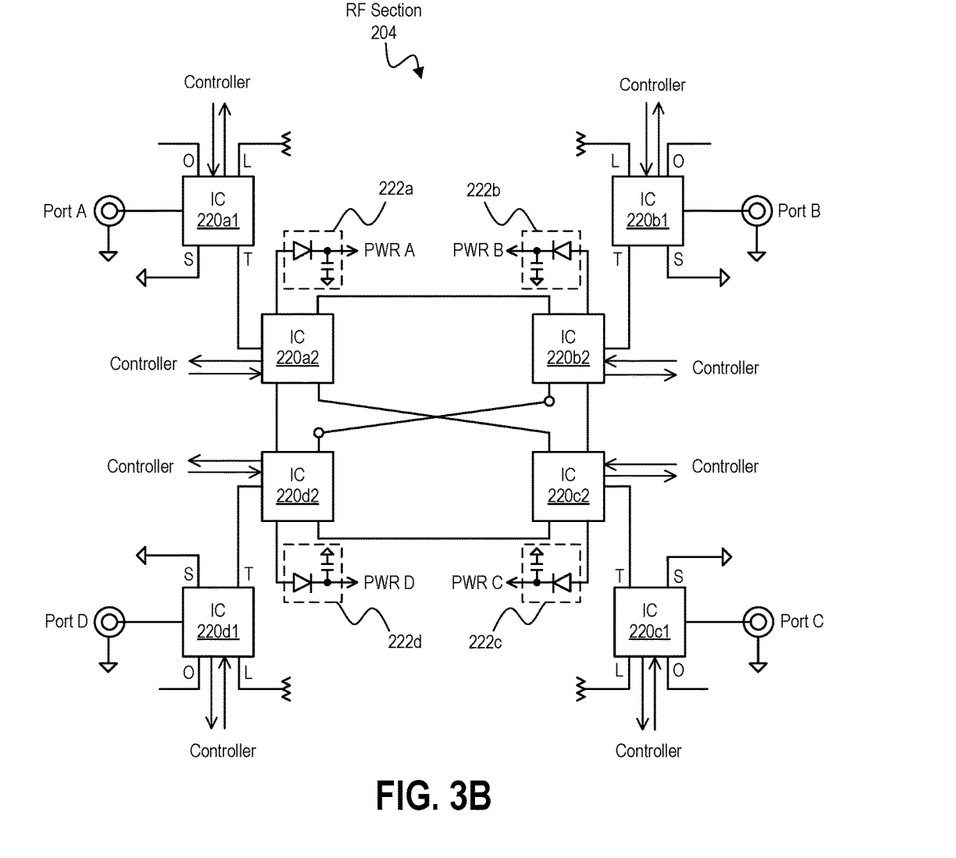
FIG. 3B is a block diagram of a radio frequency (RF) section for an implementation of a device for use in calibrating a measurement instrument, in accordance with an embodiment.

FIGS. 3A and 3B are block diagrams of an implementation of a calibration device, in accordance with an embodiment. FIG. 3A is a block diagram 202 illustrating an implementation of a digital/analog, section of the calibration device. FIG. 3B is a block diagram illustrating an implementation of a radio frequency (RF) section 204 of the calibration device. As shown, the calibration device comprises four ports for connecting to a measurement instrument, such as a VNA. Optionally, the 4-port calibration device can be used as a 2-port calibration device. In further embodiments, the calibration device can comprise a 2-port, 3-ports, or 5 or more port calibration device.

Referring again to FIG. 3A, the calibration device includes a controller 210 that can receive commands from a measurement instrument via the USB data bus 212, and transmit characterization data associated with the ports to the measurement instrument. The calibration device can also be powered via the USB data bus, or alternatively can be powered by some other source. The digital/analog section includes an analog-to-digital convertor (ADC) that can receive power measurements from the power meters associated with the ports. The ADC is switchable between the power meters, with the switching allowing the controller to selectively connect to each of the ports to determine if and which power meter is detecting a signal. The ADC communicates with the controller. The calibration device includes memory 216 for storing characterization data for each of the ports of the calibration device. As shown, the calibration device includes a 256 Mbit Flash EEPROM. As illustrated, the memory is merely exemplary, and can comprise some other non-transitory computer readable storage medium. The memory is accessible to the controller for retrieving the characterization data for the ports.

Referring again to FIG. 3B, the RF section is shown and is an implementation of the circuit of FIG. 1. The switching of the RF section can be accomplished by a chipset, for example, comprising a set of integrated circuits (ICs) 220*a*1-220*d*2, each including four switch positions 1-4. Alternatively, the switching of the RF section can be accomplished with other components. The controller can communicate with each of the ICs to control the switching of each IC. Switching ICs 220*a*1, 220*b*1, 220*c*1 and 220*d*1 are selectively switchable to connect an associated port between standards for an open (O), a short (S) and a known load (L), and a thru (T) signal path. Switching ICs 220*a*2, 220*b*2, 220*c*2 and 220*d*2 are selectively switchable to connect the associated port between the other ports and a power meter 222*a*-222*d* via the thru (T) signal path. As shown, each power meter 222*a*-222*d* includes a diode and a DC block and outputs a DC signal to the ADC of FIG. 3A. In an alternative embodiment, the calibration device can include a single power meter switchable between the ports.

Figure 4:
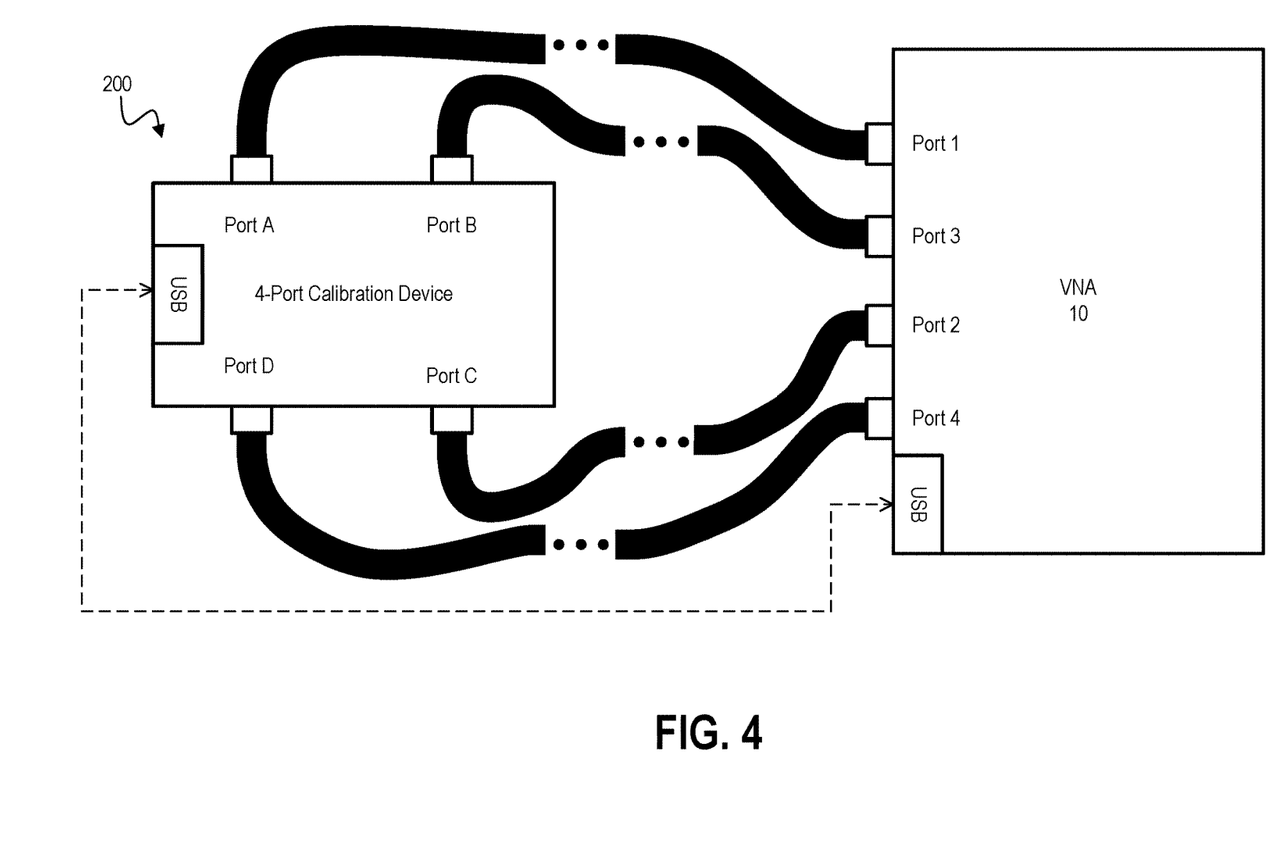
FIGS. 4-6 are block diagrams illustrating use cases for calibration devices, in accordance with embodiments.
Figure 5:
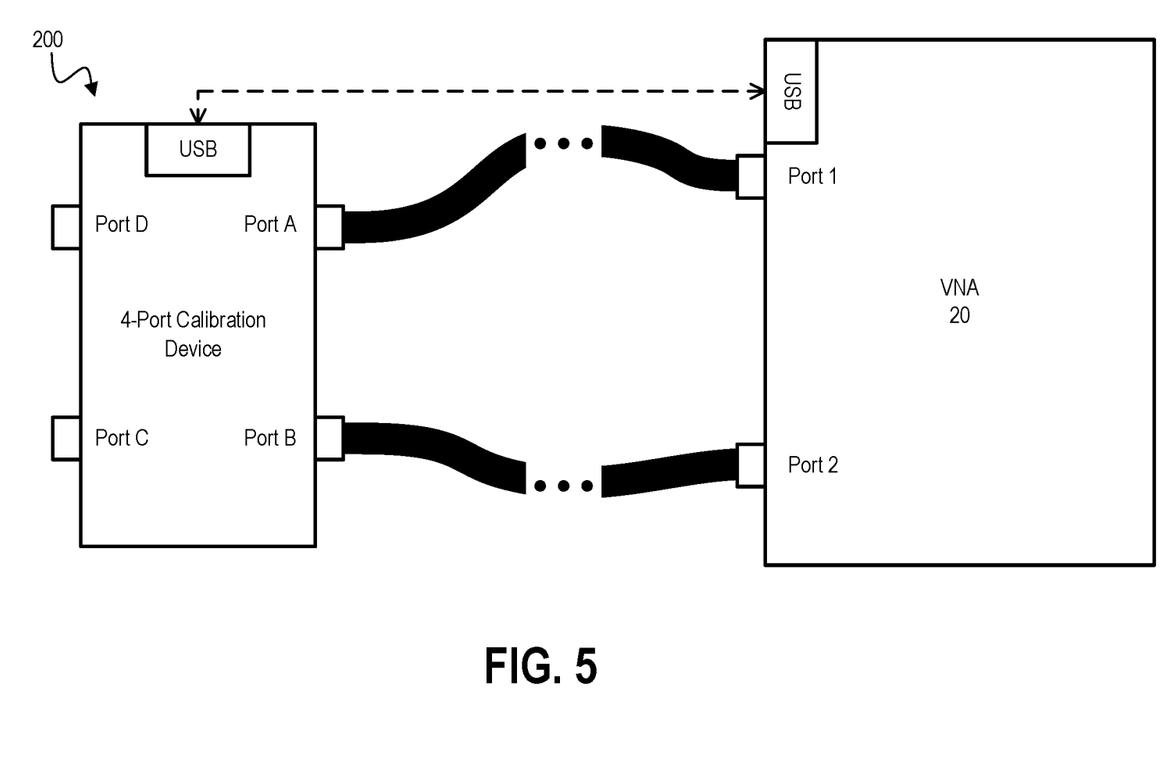
Figure 6:
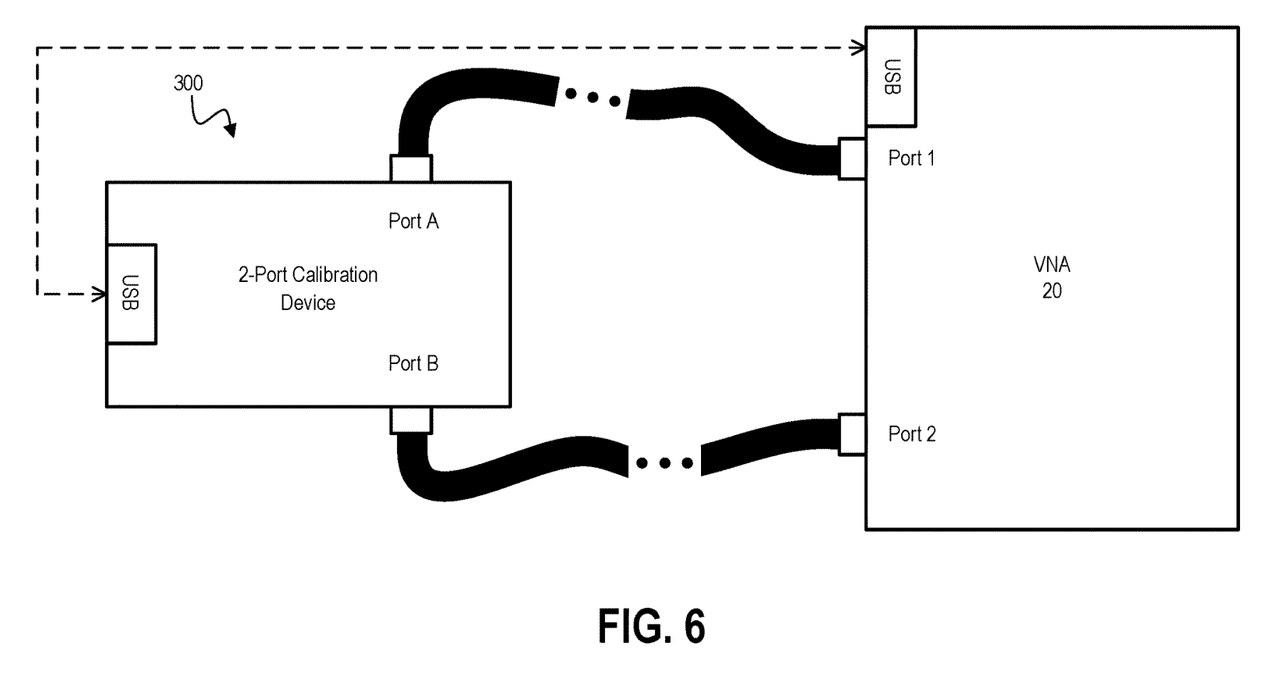

FIGS. 4-6 illustrate simplified block diagrams for different embodiments of calibration devices, measurement instruments and connection configurations. FIG. 4 illustrates a 4-port calibration device 200 connected with a 4-port VNA 10. As shown, the connection configuration need not match the sequence order of the devices and the cables are interchangeably connected. Port 1 of the VNA is connected via a coax cable with Port A of the calibration device, but Port 2 of the VNA is connected via a coax cable with Port C of the calibration device while Port 3 of the VNA is connected via a coax cable with Port B of the calibration device and Port 4 of the VNA is connected via a coax cable with Port D of the calibration device. The cables are interchangeable such that Port 1 can be connected to any open port of Ports A-D of the calibration device, and Ports 2-4 can similarly be connected to any open port of Ports A-D of the calibration device. As shown, a USB cable is connected between the calibration device and the VNA for transmitting data and commands.

FIG. 5 illustrates the 4-port calibration device 200 connected with a 2-port VNA 20. Port 1 of the VNA is connected via a coax cable with Port A of the calibration device and Port 2 of the VNA is connected via a coax cable with Port B of the calibration device. As above, the cables are interchangeable such that Port 1 can be connected to any open port of Ports A-D of the calibration device, and Port 2 can similarly be connected to any open port of Ports A-D of the calibration device. As shown, a USB cable is connected between the calibration device and the VNA for transmitting data and commands.

FIG. 6 illustrates a 2-port calibration device 300 connected with a 2-port VNA 20. Port 1 of the VNA is connected via a coax cable with Port A of the calibration device and Port 2 of the VNA is connected via a coax cable with Port B of the calibration device. As above, the cables are interchangeable such that Port 1 can be connected to any open port of Ports A and B of the calibration device, and Port 2 can similarly be connected to any open port of Ports A and B of the calibration device. As shown, a USB cable is connected between the calibration device and the VNA for transmitting data and commands.

In accordance with an embodiment, the calibration device can be designed to operate, for example, in a broad frequency range (e.g., from 300 kHz to 8.5 GHz although in other embodiments the device can be operational over a different frequency range (lower and/or higher frequencies)).

The calibration device can enable automatic, fast and error-free calibrations for a measurement instrument, such as a VNA. In accordance with an embodiment, the calibration device can be automatically powered on via the USB connection and load calibration kit coefficients from on-board memory (e.g., 256 Mbit Flash EEPROM) into the software of the measurement instrument. The calibration device is ready to use after detection by the measurement instrument. The calibration device need not require an internal heater, which can eliminate warm up time and provide stable calibration.

In accordance with an embodiment, the device can improve productivity by providing easier and faster single connection calibrations that avoids miscalibration due to misconnection. Port auto sense and port mapping feature reduce errors and can simplify multiport calibrations. The device can also be used in guided graphical test procedures to further simplify complex calibrations.

In accordance with an embodiment, calibration kit coefficients can be auto loaded to speed up setups and reduce calibration error. Software installed on the measurement instrument can be enabled to allow the measurement instrument to detect the device to provide simple and easy to use calibration software.

The number of measurement instrument ports connected can be determined by the calibration device by auto sense to prevent poor connections and calibration. In accordance with an embodiment, measurement instrument-to-device port mapping can increase flexibility and simplify multiport calibrations.

In accordance with an embodiment, the device can be USB powered and controlled to provide the convenience of a one plug interface without an external power supply. Single connection calibrations can reduce wear and tear on connectors and cables over manual calibrations.

In accordance with an embodiment, the calibration device can comply with standards for communicating in test environments. For example, the calibration device can comply with Standard Commands for Programmable Instruments (SCPI) command set can allow for easy integration into automated test environments. SCPI defines a standard for syntax and commands to use in controlling programmable test and measurement devices.

Calibrations using embodiments of the calibration device can be automatic and relatively fast. The device can be compact in size relative to measurement instruments such as VNAs, permitting easier use when moving between VNAs.

In accordance with an embodiment, a system can include a VNA and/or the calibration device for calibration of the VNA. Upon connection with VNA, the VNA automatically identifies the calibration device and is ready for use. The VNA can include automatic calibration menus in a graphical user interface (GUI) of the VNA customized for use with embodiments of the calibration device.

The foregoing description of the present invention has been provided for the purposes of illustration and description. It is not intended to be exhaustive or to limit the invention to the precise forms disclosed. Many modifications and variations will be apparent to the practitioner skilled in the art. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalents.

The invention claimed is:

1. A calibration device adapted to be used with a measurement instrument having two or more ports for transmitting and receiving radio frequency (RF) signals, the calibration device comprising:
    a controller;
    two or more ports;
    two or more power measurement circuits,
    wherein each power measurement circuit is connectable with one of the two or more ports;
    a non-transitory computer readable storage medium within which characterization data related to the two or more ports is storable;
    wherein the non-transitory computer readable storage medium is accessible to the controller;
    wherein the calibration device is adapted to be connected with the measurement instrument via a data bus to transmit and receive data between the controller and the measurement instrument;
    wherein the two or more ports are adapted to be interchangeably connectable with the two or more ports of the measurement instrument; wherein characterization data related to the two or more ports are providable to the measurement instrument based on a detection of power at the two or more power measurement circuits; and
    wherein when the two or more ports of the measurement instrument are connected with the two or more ports of the calibration device and a signal is transmitted by the measurement instrument to the calibration device, a connection configuration between the measurement instrument and the calibration device is determined based on the detection of power at the two or more power measurement circuits.

2. The calibration device of claim 1, wherein each of the two or more ports of the calibration device is selectably connectable with an open circuit, a load, a short circuit, and a thru signal path, and wherein each of the two or more ports is selectably connectable to the associated power measurement circuit via the thru signal path.

3. The calibration device of claim 1, wherein the calibration device automatically provides correct characterization data for the two or more ports to the measurement instrument based on the connection configuration of the two or more ports of the measurement instrument to the two or more ports of the calibration device.

4. The calibration device of claim 1, wherein the non-transitory computer readable storage medium is a flash memory device within the calibration device and connected to the controller.

5. The calibration device of claim 1, wherein the non-transitory computer readable storage medium is an EEPROM within the calibration device and connected to the controller.

6. The calibration device of claim 1, further comprising a USB port which is used for communicating data and commands between the calibration device and the measurement instrument.

7. A calibration device adapted to be used with a measurement instrument having port one and port two for transmitting and receiving radio frequency (RF) signals, the calibration device comprising:
 a controller;
 a first power measurement circuit;
 a first port connectable to the first power measurement circuit;
 a second power measurement circuit;
 a second port connectable to the second power measurement circuit; and
 a non-transitory computer readable storage medium within which characterization data related to the first port and the second port is storable;
 wherein the non-transitory computer readable storage medium is accessible to the controller;
 wherein the calibration device is adapted to be connected with the measurement instrument via a data bus to transmit and receive data between the controller and the measurement instrument;
 wherein the first port and the second port are adapted to be interchangeably connectable with the port one and the port two of the measurement instrument; wherein characterization data related to the two or more ports are providable to the measurement instrument based on a detection of power at the two or more power measurement circuits; and
 wherein when the port one and the port two of the measurement instrument are connected with the calibration device and a signal is transmitted by the measurement instrument to the calibration device via the port one or the port two, a connection configuration between the port one and the port two of the measurement instrument and the first port and the second port is determined based on the detection of power at the first power measurement circuit or the second power measurement circuit.

8. The calibration device of claim 7, wherein the first port and the second port of the calibration device are selectably connectable with an open circuit, a load, a short circuit, and a thru signal path, and wherein the first port is selectably connectable to the first power measurement circuit via the thru signal path and the second port is selectably connectable to the second power measurement circuit via the thru signal path.

9. The calibration device of claim 7, wherein the calibration device automatically provides correct characterization data for the first and second ports to the measurement instrument based on the connection configuration of the port one and the port two of the measurement instrument to the first port and the second port.

10. The calibration device of claim 7, further adapted to be used with a measurement instrument having port one, port two, port three and port four for transmitting and receiving radio frequency (RF) signals, the calibration device further comprising:
 a third power measurement circuit;
 a third port connectable to the third power measurement circuit;
 a fourth power measurement circuit;
 a fourth port connectable to the fourth power measurement circuit;
 wherein characterization data related to the third port and the fourth port is storable within the non-transitory computer readable storage medium;
 wherein the first port, the second port, the third port and the fourth port are adapted to be interchangeably connectable with the port one, the port two, the port three and the port four of the measurement instrument; and
 wherein when ports of the measurement instrument are connected with the calibration device and a signal is transmitted by the measurement instrument to the calibration device, a connection configuration between the measurement instrument and the first port, the second port, the third port, and the fourth port is determined based on the detection of power at the first power measurement circuit, the second power measurement circuit, the third power measurement circuit or the fourth power measurement circuit.

11. The calibration device of claim 7, wherein the non-transitory computer readable storage medium is a memory device within the calibration device and connected to the controller.

12. The calibration device of claim 7, wherein the non-transitory computer readable storage medium is an EEPROM within the calibration device and connected to the controller.

13. The calibration device of claim 7, further comprising a USB port which is used for communicating data and commands between the calibration device and the measurement instrument.

14. A calibration device adapted to be used with a measurement instrument having two or more ports for transmitting and receiving radio frequency (RF) signals, the calibration device comprising:
 a USB port;
 a controller;
 two or more ports;
 two or more power measurement circuits, wherein each power measurement circuit is connectable with one of the two or more ports;
 a memory connected to the controller and within which characterization data related to the two or more ports is storable;
 wherein the calibration device is adapted to be connected with the measurement instrument via a data bus to transmit and receive data between the controller and the measurement instrument;
 wherein the two or more ports are adapted to be interchangeably connectable with the two or more ports of the measurement instrument; wherein characterization data related to the two or more ports are providable to the measurement instrument based on a detection of power at the two or more power measurement circuits; and
 wherein when the two or more ports of the measurement instrument are connected with the two or more ports of the calibration device and a signal is transmitted by the measurement instrument to the calibration device, a connection configuration between the measurement instrument and the calibration device is determined based on the detection of power at the two or more power measurement circuits.

15. The calibration device of claim 14, wherein each of the two or more ports of the calibration device is selectably connectable with an open circuit, a load, a short circuit, and a thru signal path, and wherein each of the two or more ports is selectably connectable to the associated power measurement circuit via the thru signal path.

16. The calibration device of claim 14, wherein the calibration device automatically provides correct characterization data for the two or more ports to the measurement instrument based on the connection configuration of the two or more ports of the measurement instrument to the two or more ports of the calibration device.

17. The calibration device of claim 14, wherein the USB port is used for communicating data and commands between the calibration device and the measurement instrument.

\* \* \* \* \*